(12) United States Patent
Short et al.

(10) Patent No.: US 7,570,101 B1
(45) Date of Patent: Aug. 4, 2009

(54) ADVANCED INSULATED GATE BIPOLAR TRANSISTOR GATE DRIVE

(75) Inventors: James Evans Short, Monongahela, PA (US); Shawn Michael West, West Mifflin, PA (US); Robert J. Fabean, Donora, PA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 12/037,991

(22) Filed: Feb. 27, 2008

(51) Int. Cl.
*H03K 17/60* (2006.01)
(52) U.S. Cl. ........................ 327/432; 327/478
(58) Field of Classification Search ............... 327/432, 327/434, 478
See application file for complete search history.

(56) References Cited

U.S. PATENT DOCUMENTS

| | | | |
|---|---|---|---|
| 4,675,547 A * | 6/1987 | Eichenwald | 327/109 |
| 4,721,869 A | 1/1988 | Okado | |
| 4,777,387 A * | 10/1988 | Collins | 327/109 |
| 4,949,213 A * | 8/1990 | Sasagawa et al. | 361/91.4 |
| RE34,107 E | 10/1992 | Wirth | |
| 5,200,878 A * | 4/1993 | Sasagawa et al. | 361/98 |
| 5,200,879 A * | 4/1993 | Sasagawa et al. | 361/94 |
| 5,812,010 A | 9/1998 | Houk | |
| 5,844,248 A * | 12/1998 | Yang | 250/551 |
| 5,852,538 A | 12/1998 | Masui | |
| 5,910,738 A * | 6/1999 | Shinohe et al. | 327/108 |
| 6,859,087 B2 | 2/2005 | Galli et al. | |
| 7,336,118 B2 * | 2/2008 | Ishikawa et al. | 327/432 |
| 2004/0223277 A1 | 11/2004 | Cheng et al. | |

FOREIGN PATENT DOCUMENTS

| | | |
|---|---|---|
| JP | 6152359 | 5/1994 |
| JP | 9107069 | 4/1997 |

* cited by examiner

*Primary Examiner*—Lincoln Donovan
*Assistant Examiner*—William Hernandez
(74) *Attorney, Agent, or Firm*—Annette R. Reimers; Paul A. Gottlieb

(57) ABSTRACT

A gate drive for an insulated gate bipolar transistor (IGBT) includes a control and protection module coupled to a collector terminal of the IGBT, an optical communications module coupled to the control and protection module, a power supply module coupled to the control and protection module and an output power stage module with inputs coupled to the power supply module and the control and protection module, and outputs coupled to a gate terminal and an emitter terminal of the IGBT. The optical communications module is configured to send control signals to the control and protection module. The power supply module is configured to distribute inputted power to the control and protection module. The control and protection module outputs on/off, soft turn-off and/or soft turn-on signals to the output power stage module, which, in turn, supplies a current based on the signal(s) from the control and protection module for charging or discharging an input capacitance of the IGBT.

20 Claims, 11 Drawing Sheets

ADVANCED INSULATED GATE BIPOLAR TRANSISTOR GATE DRIVE

STATEMENT REGARDING FEDERALLY SPONSORED RESEARCH

The U.S. Government has a paid-up license in this invention and the right in limited circumstances to require the patent owner to license others on reasonable terms as provided for by the terms of Contract No. DE-AC11-98PN38206 awarded by the Department of Energy.

BACKGROUND OF THE INVENTION

1. Field of the Invention

The present invention generally relates to a gate drive and, more specifically, to a gate drive for an insulated gate bipolar transistor (IGBT).

2. Description of Related Art

Power electronic based power supplies are becoming more common in commercial industry and military applications. Such power supplies are replacing their mechanical counterparts (i.e., motor generator set), because they offer higher reliability, better regulation and smaller size than the mechanical counterparts. The power electronic transistor that is widely used in these power supplies is an insulated gate bipolar transistor (IGBT).

With reference to FIG. 1, IGBT, denoted generally as reference numeral 1, has three terminals: collector 3, gate 5, and emitter 7. Typically, an IGBT gate drive connects to gate terminal 5 and emitter terminal 7; collector terminal 3 and emitter terminal 7 are connected to the power portion of the circuit. As the voltage from gate 5 to emitter 7 increases above a threshold voltage (about 5 volts), IGBT 1 turns on and current can flow from collector 3 to emitter 7. IGBT 1 is typically operated in switch mode (i.e., either fully on or fully off). This switch mode minimizes the power dissipation in the device.

With reference to FIG. 2 and with continuing reference to FIG. 1, IGBTs are commonly designed to only conduct current in one direction and typically a free wheeling diode (FWD) 9 is placed inside IGBT 1 module, which is electrically connected anti-parallel to IGBT 1. FWD 9 provides a path for an inductive load current to flow when the IGBTs are off.

An IGBT is typically connected at its emitter to one end of a load whose other end is connected to a power supply voltage. The power supply voltage may range from a few volts to several thousand volts, and the load current through the load and the IGBT may range from the milliampere region to a hundred or more amperes. In order to minimize the power dissipation across the IGBT, a large turn-on voltage (e.g., 12-15 volts) is normally applied to the gate of the IGBT to cause the IGBT to be operated in the saturation region with its collector-to-emitter voltage ($V_{ce}$) in the order of a few volts. However, a problem occurs if, when the IGBT is fully turned on and carrying a large current, the load is shorted. The IGBT is then subjected to an excessive power dissipation condition due to the high current through the IGBT and the rising voltage developed across the collector-to-emitter of the IGBT. If a short circuit condition exists (or develops) and persists, the IGBT will fail due to the excessive power dissipation. This factor and others conspire to increase the chances of latch-up if the short-circuit condition persists for too long before the device is turned off.

It is, therefore, necessary to turn off an IGBT if, and when, a fault condition, such as a short circuit, develops or exists. Prior art schemes for turning off an IGBT subjected to a short circuit condition rely on applying a relatively sharp turn-off voltage to the gate of the IGBT when a short circuit condition is sensed. However, it has been discovered that trying to turn off an IGBT sharply and rapidly when the IGBT is carrying a very large current and is subjected to a short circuit condition may cause the IGBT to lose control and fail. Thus, if the IGBT loses control over the load current flowing through it while its $V_{ce}$ keeps increasing, the IGBT will fail due to excessive power dissipation. Another scheme for turning off an IGBT subjected to a short circuit condition maintains the full turn-on voltage applied to the gate for a time interval of several microseconds after the detection of a short circuit condition in order to maintain control. During this time interval, the $V_{ce}$ of the IGBT rises towards the load supply voltage. Following the time interval, the turn-on voltage is removed. However, while the IGBT is on, its power dissipation is very high, and the IGBT may fail due to excessive power dissipation.

The problems present in the prior art are significantly reduced in IGBT gate drives in accordance with the present invention.

SUMMARY OF THE INVENTION

The present invention is directed to a gate drive for an insulated gate bipolar transistor (IGBT). The gate drive includes a control and protection module coupled to a collector terminal of the IGBT, an optical communications module coupled to the control and protection module, a power supply module coupled to the control and protection module, an output power stage module with inputs coupled to the power supply module and the control and protection module and outputs coupled to a gate terminal and an emitter terminal of the IGBT. The optical communications module is configured to send control signals to the control and protection module. The power supply module is configured to distribute inputted power to the control and protection module. The control and protection module outputs on/off, soft turn-off and/or soft turn-on signals to the output power stage module, which, in turn, supplies a current based on the signal(s) from the control and protection module for charging or discharging an input capacitance of the IGBT.

The optical communications module may include three fiber optic cables that interface with the control and protection module. The three fiber optic cables may include: a control fiber optic cable providing a signal to the control and protection module indicating when to turn on and off; a feedback fiber optic cable providing an output signal from the control and protection module indicating whether the gate drive is functioning normally or if a fault has been detected; and an emergency turn-off fiber optic cable providing a signal to the control and protection module forcing a protective action if a fault has been detected. The optical communications module may provide an interface between control circuitry of a power supply and the control and protection module.

The control and protection module may include a desaturation and sliver protection module coupled to the optical communications module, the output power stage module and the power supply module. The control and protection module may also include a desaturation feedback module coupled to the desaturation and sliver protection module and the collector terminal of the IGBT. The desaturation feedback module of the control and protection module may be configured to measure a collector-emitter voltage of the IGBT to determine if the IGBT is conducting excessive current.

The control and protection module may include a jumper for allowing the gate drive to monitor and be coupled to IGBTs configured in a multi-level pole configuration. The power supply module may be configured to receive a voltage from a power supply, isolate the inputted voltage and distribute the isolated voltage to the control and protection module and the output power stage module. The output power stage module may include a plurality of metal oxide semiconductor field effect transistor (MOSFET) transistors configured to provide the necessary current for charging and discharging the input capacitance of the IGBT.

The present invention is also a method of driving an insulated gate bipolar transistor (IGBT). The method includes the steps of providing a gate drive coupled to at least one IGBT. The gate drive includes a control and protection module coupled to a collector terminal of the IGBT; an optical communications module coupled to the control and protection module and to control circuitry of a power supply; a power supply module coupled to the control and protection module and the power supply; an output power stage module with inputs coupled to the power supply module and the control and protection module; and outputs coupled to a gate terminal and an emitter terminal of the IGBT. Next, inputted power is distributed from the power supply module to the control and protection module and the output power stage module. Thereafter, control signals comprising at least one of on/off, soft turn-off, soft turn-on and emergency turn-off signals are sent from the control circuitry of the power supply through the optical communications module to the control and protection module. Then, control signals are outputted from the control and protection module to the output power stage module based on the control signals from the control circuitry of the power supply. Finally, a current based on the signal(s) from the control and protection module is supplied for charging or discharging an input capacitance of the IGBT.

The control and protection module may include a desaturation and sliver protection module coupled to the optical communications module, the output power stage module and the power supply module. The control and protection module may include a desaturation feedback module coupled to the desaturation and sliver protection module and the collector terminal of the IGBT. The desaturation feedback module of the control and protection module may be configured to measure collector-emitter voltage of the IGBT to determine if the IGBT is conducting excessive current.

The control and protection module may include a jumper for allowing the gate drive to monitor and be coupled to IGBTs configured in a multi-level pole configuration. The power supply module may receive a voltage from the power supply, isolate the inputted voltage and distribute the isolated voltage to the control and protection module and the output power stage module. The output power stage module may include a plurality of MOSFET transistors configured to provide the necessary current for charging and discharging the input capacitance of the IGBT.

The optical communications module may include three fiber optic cables that interface with the control and protection module. The three fiber optic cables may include a control fiber optic cable providing a signal to the control and protection module indicating when to turn on and off; a feedback fiber optic cable providing an output signal from the control and protection module to the control circuitry of the power supply indicating whether the gate drive is functioning normally or if a fault has been detected; and an emergency turn-off fiber optic cable providing a signal to the control and protection module forcing a protective action if a fault has been detected by the control circuitry of the power supply.

The present invention is further directed to a gate drive for an insulated gate bipolar transistor (IGBT). The gate drive includes an optical communications module providing an interface between the gate drive and control circuitry of a power supply. The optical communications module includes a control fiber optic cable providing a signal to a control and protection module of the gate drive indicating when to turn on and off; a feedback fiber optic cable providing an output signal from the control and protection module to the control circuitry of the power supply indicating whether the gate drive is functioning normally or if a fault has been detected; and an emergency turn-off fiber optic cable providing a signal to the control and protection module forcing a protective action if a fault has been detected by the control circuitry of the power supply. The control and protection module has an output coupled to a collector terminal of the IGBT. A power supply module is coupled to the control and protection module. The power supply module is configured to distribute inputted power to the control and protection module. An output power stage module is provided with inputs coupled to the power supply module and the control and protection module, and outputs coupled to a gate terminal and an emitter terminal of the IGBT. The control and protection module outputs on/off, soft turn-off and/or soft turn-on signals to the output power stage module, which, in turn, supplies a current based on the signal(s) from the control and protection module for charging or discharging an input capacitance of the IGBT.

These and other features and characteristics of the present invention will become more apparent upon consideration of the following description and the appended claims with reference to the accompanying drawings, all of which form a part of this specification. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

BRIEF DESCRIPTION OF THE DRAWINGS

FIG. 7 is a waveform diagram illustrating the gate-emitter voltage ($V_{ge}$) of an IGBT vs. time (t) during a normal turn-on and a soft turn-on;

DETAILED DESCRIPTION OF THE INVENTION

Figure 1:
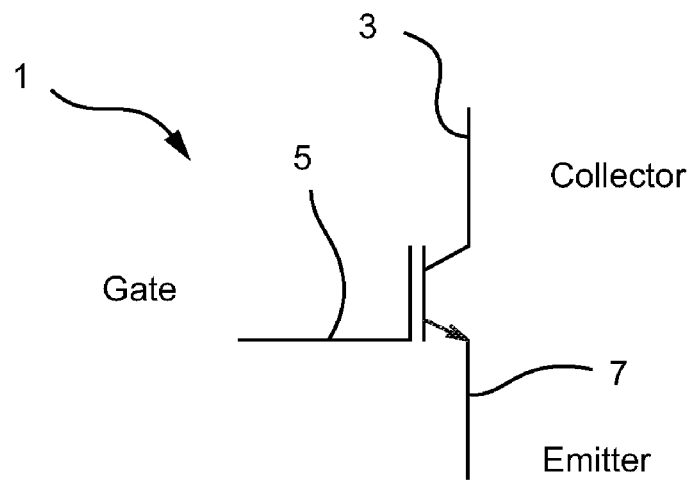
FIG. 1 is a symbolic representation of a conventional IGBT.
Figure 2:
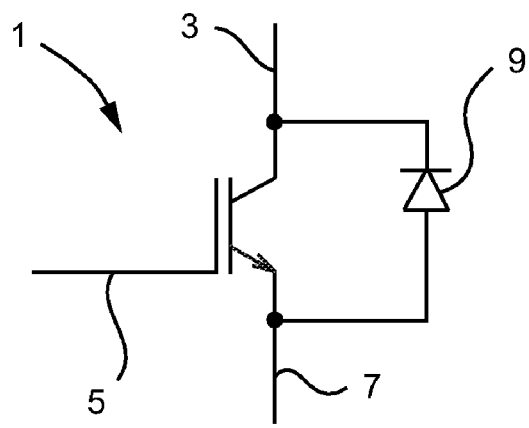
FIG. 2 is a symbolic representation of a conventional IGBT with a FWD connected between the collector and emitter of the IGBT.
Figure 3:
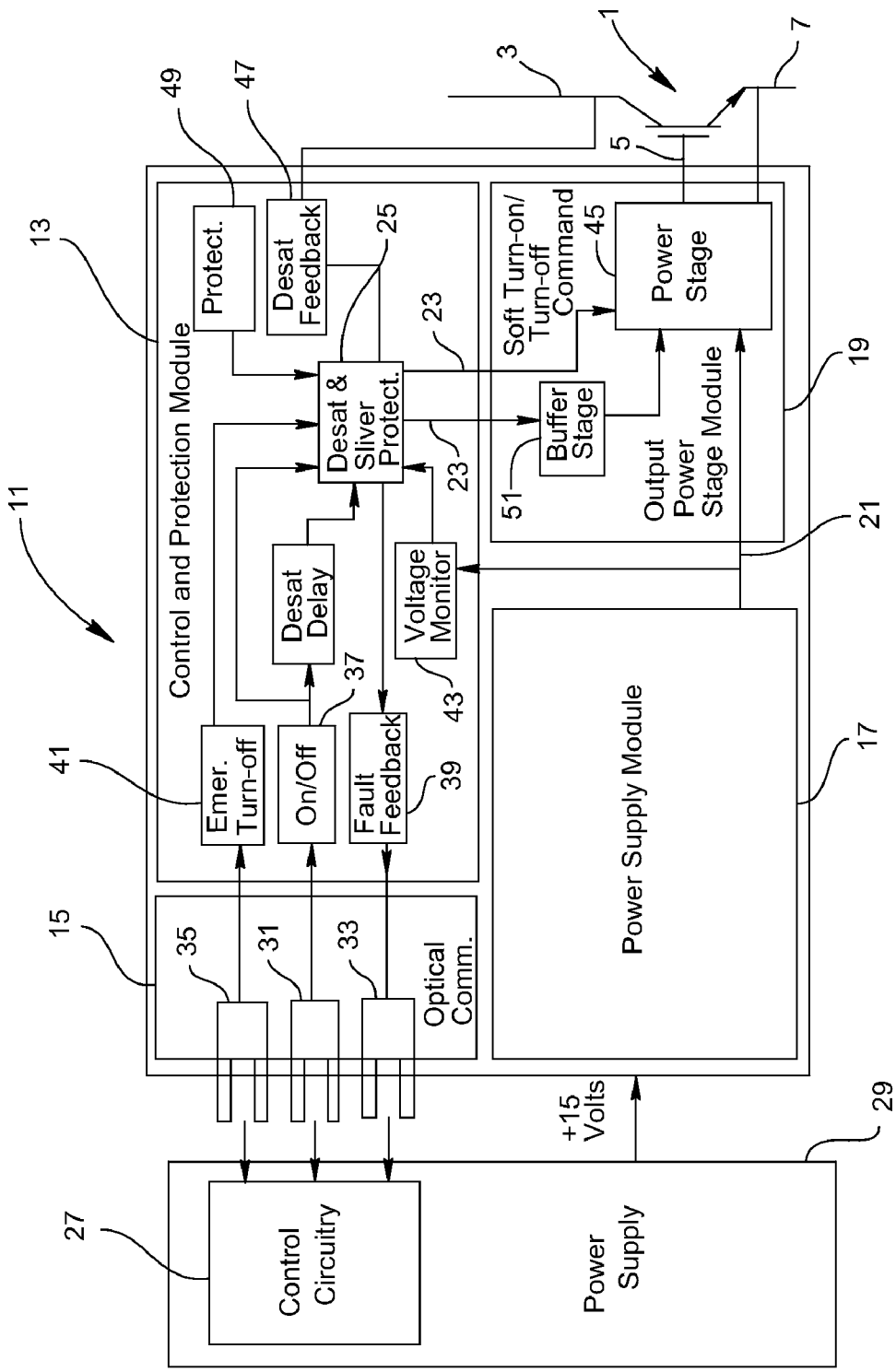
FIG. 3 is a simplified schematic diagram of a gate drive for an IGBT in accordance with the present invention.
Figure 4:
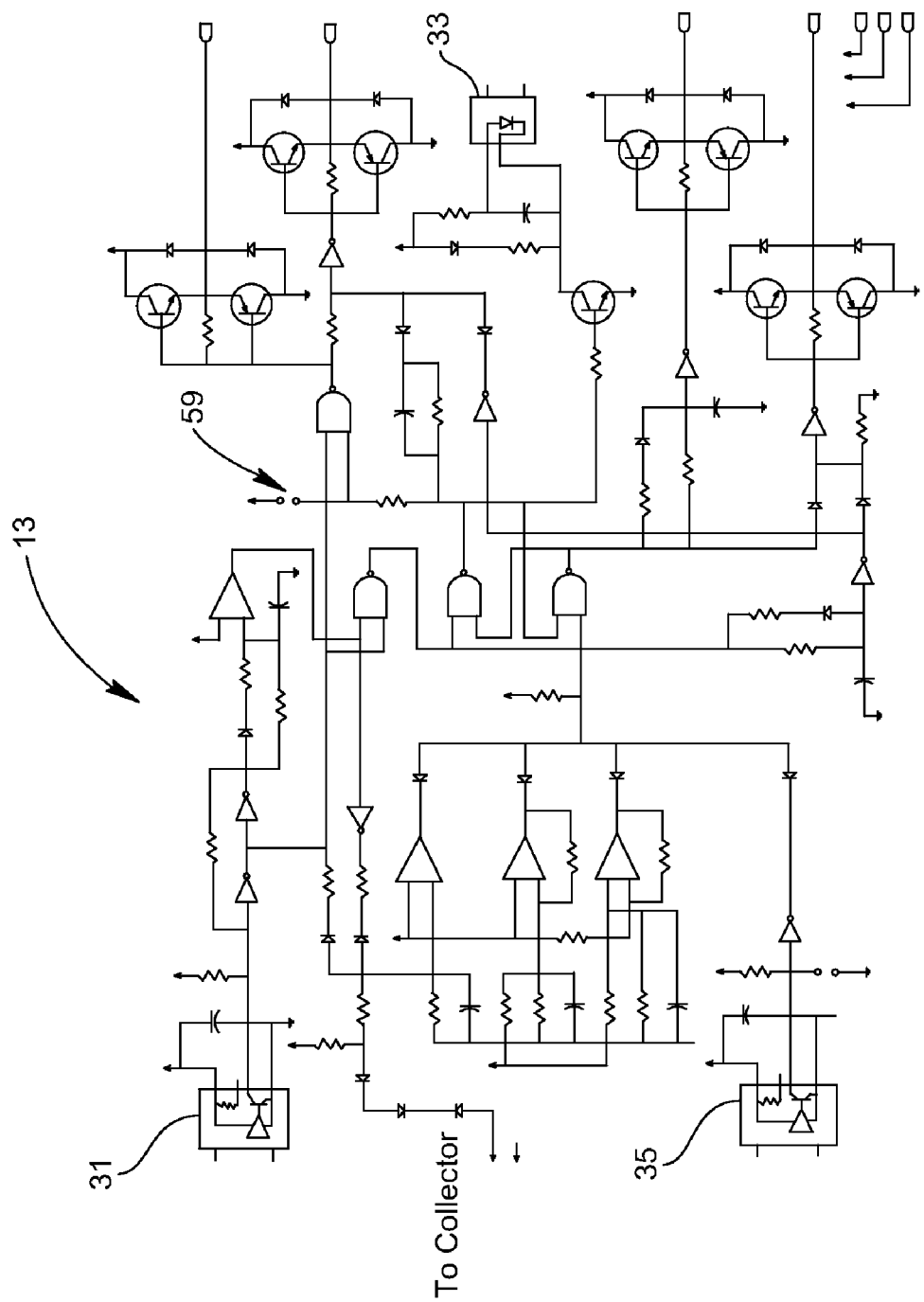
FIG. 4 is a detailed schematic diagram of a control and protection module of the gate drive of FIG. 3.
Figure 5:
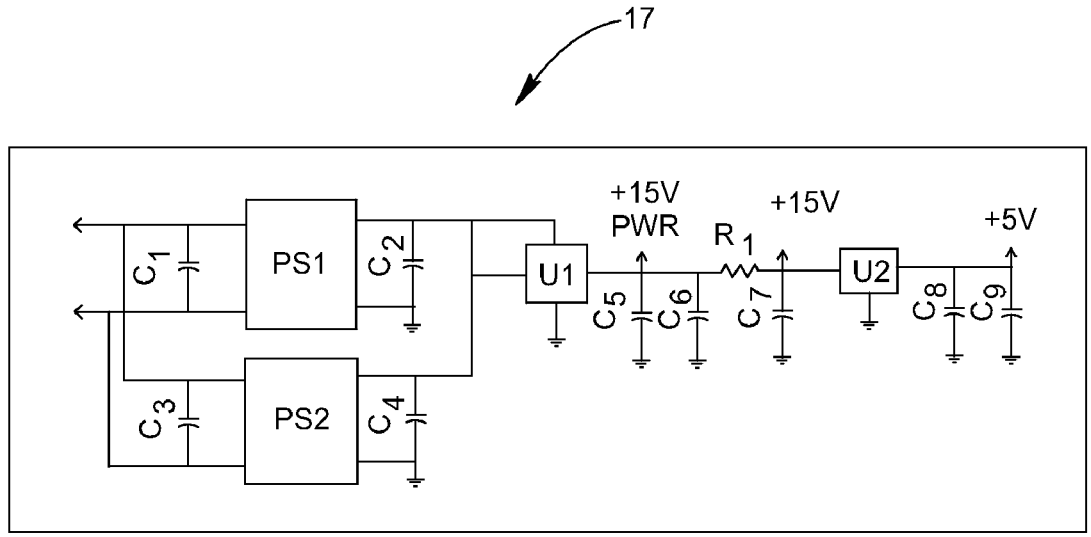
FIG. 5 is a detailed schematic diagram of a power supply module of the gate drive of FIG. 3.
Figure 6:
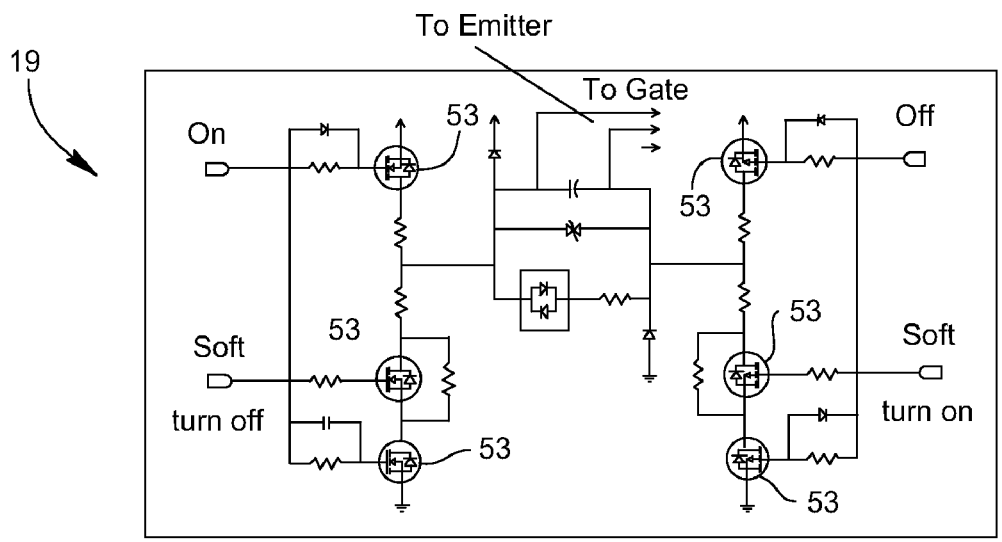
FIG. 6 is a detailed schematic diagram of an output power stage module of the gate drive of FIG. 3.

The present invention will be described with reference to the accompanying figures where like reference numbers correspond to like elements.

With reference to FIGS. 3 through 6, a gate drive 11 for an IGBT 1 includes a control and protection module 13 coupled to the collector terminal 3 of IGBT 1, an optical communications module 15 coupled to control and protection module 13, a power supply module 17 coupled to control and protection module 13 and an output power stage module 19 with a first input 21 coupled to power supply module 17 and second inputs 23 coupled to a desaturation and sliver protection module 25 of control and protection module 13. Output power stage module 19 also includes outputs coupled to the gate terminal 5 and the emitter terminal 7 of IGBT 1.

Optical communications module 15 provides an interface between control circuitry 27 of a power supply 29 and control and protection module 13. Optical communications module 15 includes three fiber optic cables that interface with control and protection module 13. The three fiber optic cables include a control fiber optic cable 31, a feedback fiber optic cable 33 and an emergency turn-off fiber optic cable 35. Control fiber optic cable 31 provides a signal to control and protection module 13 indicating when to turn on and off based on a signal from control circuitry 27 of power supply 29. The feedback fiber optic cable 33 provides an output signal from control and protection module 13 to control circuitry 27 of power supply 29 indicating whether gate drive 11 is functioning normally or if a fault has been detected. Emergency turn-off fiber optic cable 35 provides a signal to control and protection module 13 that forces a protective action if a fault has been detected by control circuitry 27 of power supply 29. Each of the fiber optic cables interface control and protection module 13 via an appropriate interface. Specifically, control fiber optic cable 31 interfaces with control and protection module 13 via an on/off interface 37; feedback fiber optic cable 33 interfaces with control and protection module 13 via a fault feedback interface 39; and an emergency turn-off fiber optic cable 35 interfaces with control and protection module 13 via an emergency turn-off interface 41.

Power supply module 17 provides the power supply for gate drive 11. Power supply module 17 is configured to receive a voltage of, for instance, 15 volts from power supply 29, isolate the inputted voltage and distribute the isolated voltage to a voltage monitor 43 of control and protection module 13 and a power stage 45 of output power stage module 19. A detailed schematic diagram of power supply module 17 is provided in FIG. 5. As shown in the schematic diagram, power supply module 17 includes a first inverter PS1, a second inverter PS2, a low dropout voltage regulator U1, a positive voltage regulator U2 and nine capacitors $C_1$-$C_9$.

Control and protection module 13 performs the major logic functions for gate drive 11. Control and protection module 13 includes desaturation and sliver protection module 25, on/off interface 37, fault feedback interface 39, emergency turn-off interface 41, voltage monitor 43, desaturation feedback module 47 and protection mode module 49. Desaturation and sliver protection module 25 is coupled to optical communications module 15 via on/off interface 37, fault feedback interface 39 and emergency turn-off interface 41. Desaturation and sliver protection module 25 is also coupled to power supply module 17 via voltage monitor 43.

Desaturation and sliver protection module 25 receives inputs from desaturation feedback module 47 and protection mode module 49. Desaturation feedback module 47 is coupled to desaturation and sliver protection module 25 and the collector terminal 3 of IGBT 1. Desaturation feedback module 47 is configured to measure a collector-emitter voltage of IGBT 1 to determine if IGBT 1 is conducting excessive current as will be discussed in greater detail hereinafter. Desaturation and sliver protection module 25 outputs on/off, soft turn-off and/or soft turn-on signals to output power stage module 19. A detailed schematic diagram of control and protection module 13 is provided in FIG. 4.

Output power stage module 19 includes a buffer stage 51 and power stage 45. Buffer stage 51 buffers the on/off signal from desaturation and sliver protection module 25 of control and protection module 13 for power stage 45. Power stage 45 also receives soft turn-on and soft turn-off signals from desaturation and sliver protection module 25 of control and protection module 13 via one of inputs 23. Output power stage module 19 receives +15 volts from power supply module 17. Output power stage module 19 further includes low loss MOSFET transistors 53 to supply the necessary current for charging and discharging an input capacitance of IGBT 1. Power stage 45 is coupled to gate terminal 5 and emitter terminal 7 of IGBT 1. A detailed schematic diagram of output power stage module 19 is provided in FIG. 6.

In operation, gate drive 1 provides +15 volts to turn on IGBT 1 and provides −15 volts to turn off IGBT 1. The input to IGBT 1 appears like a capacitor. Gate drive 1 includes several operational features that are summarized below and discussed in detail hereinafter.

1) Initial Energization in Fault Mode—This feature places the gate drive in a fault mode upon initial energization;

2) Soft Turn-On—This feature turns the IGBT on slowly for the first pulse after a fault condition;

3) 2-Level and Multi-level Control—This feature permits the same gate drive to be used for various power pole configurations;

4) Sliver Pulse Soft Turn-Off—This feature prevents a hard turn-off from short control pulses during a potential short circuit; and 5) Emergency Turn-Off—This feature provides the graceful turn-off of an IGBT without the IGBT gate drive detecting a fault.

Each of the above-mentioned gate drive features of the present invention will be discussed hereinafter with reference to the accompanying drawings.

1) Initial Energization in Fault Mode

In operation, gate drive 11 enters a fault mode when initially powered with +15 volts from power supply 29. For gate drive 11 to enter a ready mode, control circuitry 27 of power supply 29 must command gate drive 11 to turn on. If there are no faults, such as, but not limited to short-circuits, as indicated by gate drive 11 to control circuitry 27 of power supply 29 through feedback fiber optic cable 33, power supply 29 starts running. This feature permits the soft turn-on feature, discussed hereinafter, to engage. This initial energization in fault mode differs from conventional IGBT gate drives in that conventional IGBT gate drives power up in a ready mode or a random mode.

2) Soft Turn-On

The soft turn-on feature of gate drive 11 of the present invention allows IGBT 1 to turn on softly (i.e., at a much slower rate than a normal hard turn-on) for the first pulse following a fault.

Figure 7:
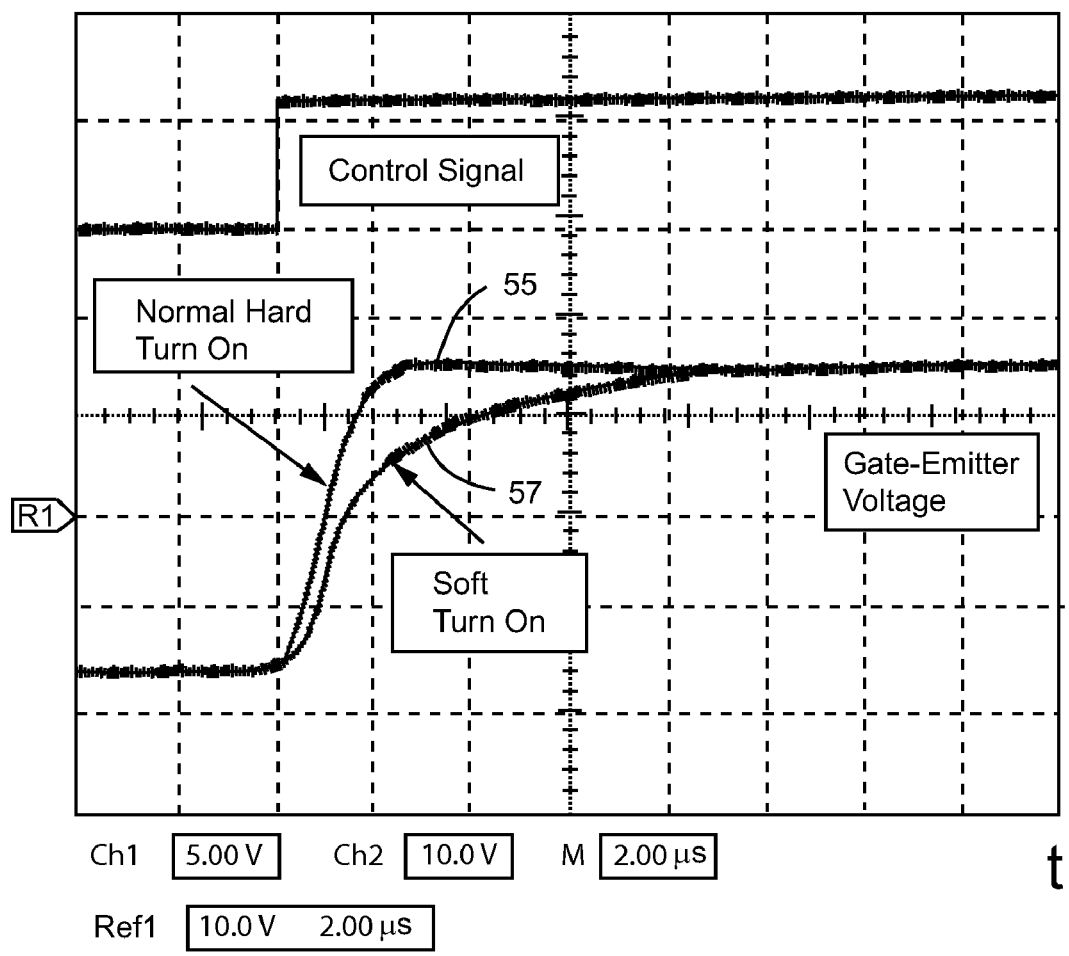

Following initial gate drive energization, as discussed hereinabove, gate drive 11 is commanded on to clear the fault and enters the ready mode. Since this is the first pulse following a fault, IGBT 1 is gated on softly. The benefit of a soft turn-on is the greatly reduced power dissipation when turning on into a fault. If power supply 29 has a fault, for instance, but not limited to a shorted load, and IGBT 1 is turned on into this short, IGBT 1 will be subjected to very high currents and significant power dissipation. However, if IGBT 1 is turned on slowly, the energy dissipated in IGBT 1 is a factor of ten times less than a hard turn-on into a fault. FIG. 7 illustrates a control signal Ch1, zero voltage R1, a main display window timebase M, and the gate-emitter voltage ($V_{ge}$) of IGBT 1 vs. time (t) during a normal hard turn-on 55 (Ref1) and a soft turn-on 57 (Ch2). With reference to FIG. 7, this waveform illustrates that rate-of-rise of the $V_{ge}$ with the soft turn-on is much slower than the hard turn-on. This eases IGBT 1 on into a potential fault and permits desaturation feedback module 47 of gate drive 11 to sense the short circuit and take a protective action.

The soft turn-on feature is not only beneficial during initial power supply startup but also enhances the robustness of power supply 29 after a fault has occurred. For example, if power supply 29 turns itself off due to a protective action, a restart is attempted to determine if there was a hard failure or if noise created a false trip. When power supply 29 is restarted, a soft turn-on is performed when gate drive 11 is cleared. If a hard fault is present, then the power dissipated in IGBT 1 is much less than with a hard turn-on. If no fault is present indicating noise created a false trip, then power supply 29 simply starts operating.

3) 2-Level and Multi-Level Control

Figure 8A:
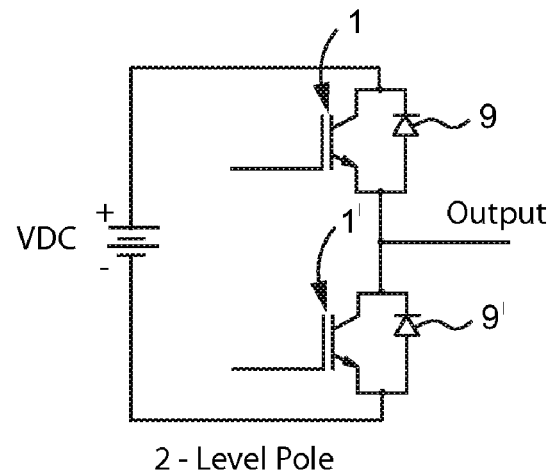
FIGS. 8A and 8B are schematic diagrams of IGBTs arranged in a 2-level pole configuration and a 3-level pole configuration, respectively.

Gate drive 11 may be configured to control IGBTs in 2-level or multi-level pole configurations. IGBTs (or other power switches) may be configured in many ways to form a power pole. With reference to FIG. 8A, IGBTs 1 and 1' with FWDs 9 and 9' may be configured in a 2-level pole configuration. A voltage VDC is provided by a power supply as shown in FIGS. 8A, 8B, 9A, 9B, 10A, 10B, 13A and 13B. The 2-level pole is used to construct H-bridges and three phase inverters, DC-to-DC chopper poles and the like. In a 2-level pole, the IGBTs rated voltage must be greater than a DC link voltage.

Figure 8B:
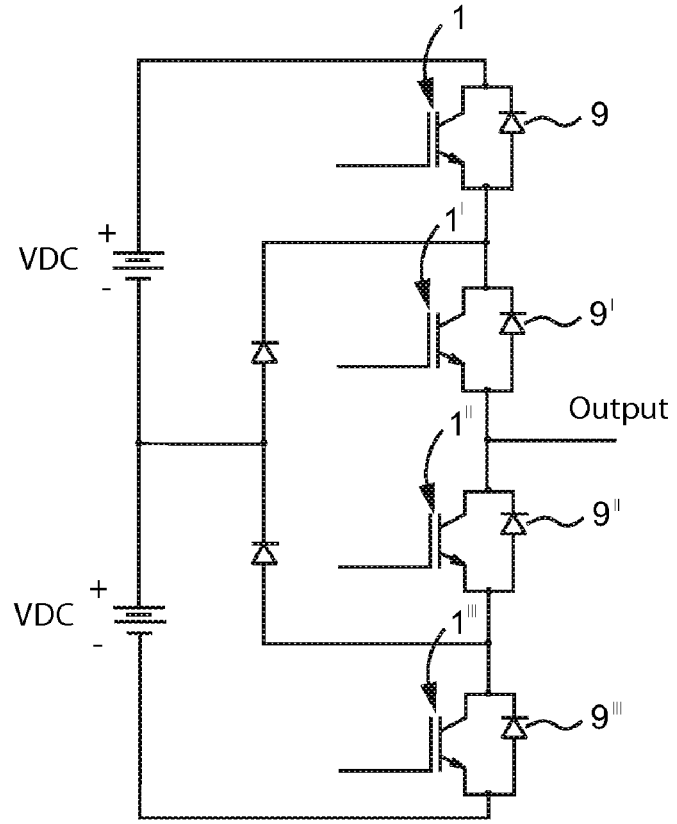

Another power pole configuration is a multi-level pole and is used where IGBTs have a lower voltage rating than the DC link voltage being applied. With reference to FIG. 8B, a 3-level pole configuration is provided as an example of a multi-level pole configuration. The 3-level pole configuration includes IGBTs 1, 1', 1" and 1''' and FWDs 9, 9', 9" and 9'''.

Gate drive 11 includes a jumper 59 that places it in 2-level or multi-level mode. Jumper 59 configures desaturation feedback module 47 for 2-level or multi-level mode.

From the 2-level pole configuration shown in FIG. 8A, when an IGBT 1 is on, it can be seen that the IGBT 1' must be able to withstand the DC link voltage. With the 3-level pole shown in FIG. 8B, at least two IGBTs are always off to block the entire DC link voltage.

Figure 9A:
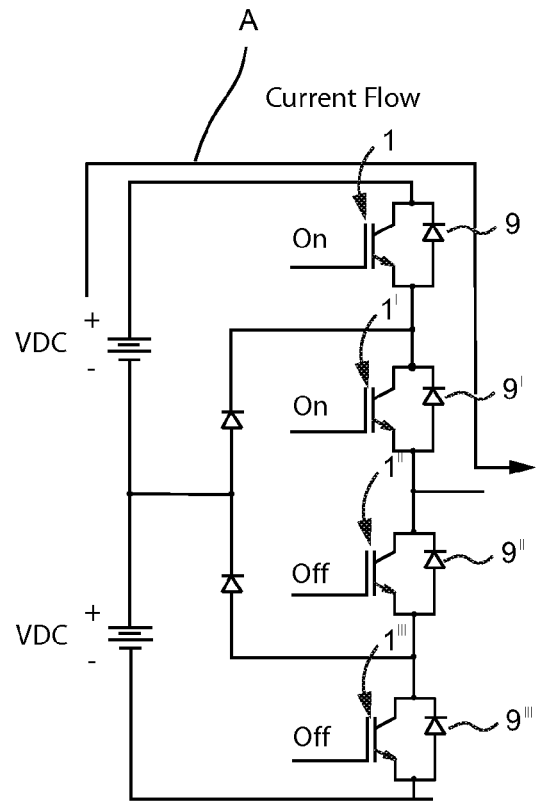
FIGS. 9A and 9B are schematic diagrams of IGBTs arranged in a 3-level pole configuration illustrating current flow and excessive voltage if an incorrect IGBT is turned off.
Figure 9B:
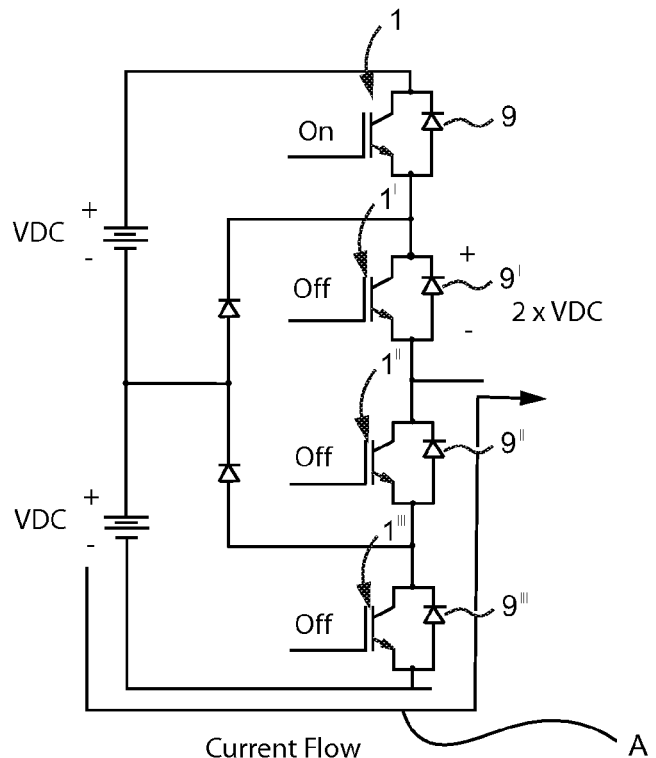

With reference to FIGS. 9A and 9B, the gate drive issue for 2-level and multi-level control occurs during fault conditions. If gate drive 11 detects that an IGBT 1 is undertaking a fault (through the measurement of the IGBTs on-state voltage indicating that it is conducting excessive current), gate drive 11 turns the IGBT off using a soft turn-off, which will be described hereinafter. Such operation is acceptable for a 2-level pole, since each IGBT 1 and 1' can withstand the entire DC link voltage. However, for a 3-level pole, each IGBT 1, 1', 1" and 1''' cannot withstand the full DC link voltage, and an autonomous protective action can actually cause the destruction of an IGBT. FIGS. 9A and 9B illustrate a 3-level pole providing current and the excessive voltage created if an incorrect IGBT is turned off.

With specific reference to FIG. 9A, the two upper IGBTs 1 and 1' are conducting and the two lower IGBTs 1" and 1''' are off. Accordingly, current flows in the direction indicated by arrow A. Suppose that IGBT 1' that was on is turned off as shown in FIG. 9B. The current transitions to the lower two FWDs 9" and 9''' as shown by arrow A and the voltage that appears across the IGBT 1' is twice the individual supply voltage or the entire DC link voltage, which will cause IGBT 1' to be destroyed due to over voltage. Therefore, for multi-level operation, gate drive 11 cannot operate automatically by turning off an IGBT during a fault.

When gate drive 11 is in multi-level mode, any detected fault will be indicated to control circuitry 27 of power supply 29 by feedback fiber optic cable 33. Control circuitry 27 must turn-off IGBTs 1, 1', 1" and 1''' in the proper sequence to avoid an over voltage of an individual IGBT. When gate drive 11 is commanded off, it will proceed with a soft turn-off of the faulted IGBT.

Figure 10A:
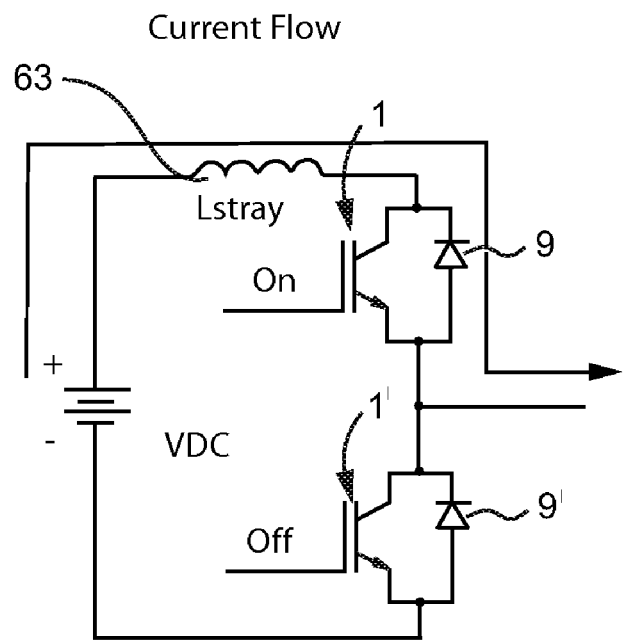
FIGS. 10A and 10B are schematic diagrams of IGBTs arranged in a 2-pole configuration illustrating a voltage spike that is developed due to stray inductance of the wiring when one of the IGBTs turns off.
Figure 10B:
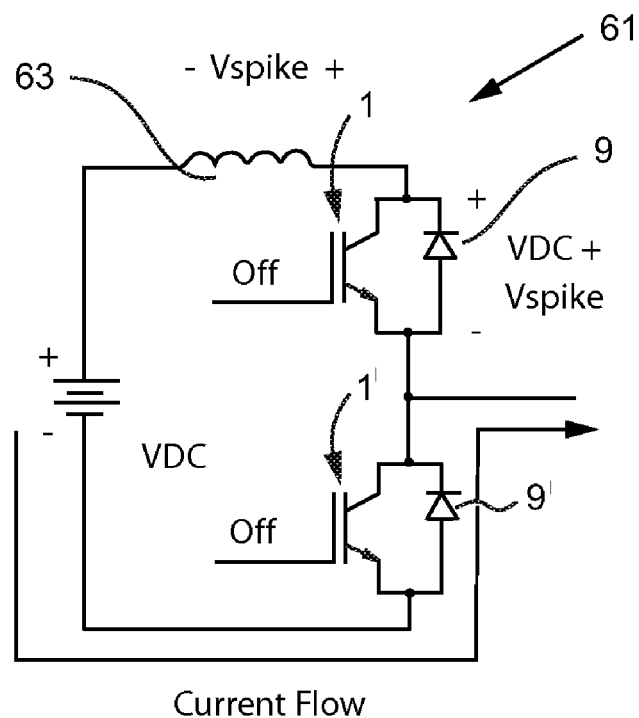

With reference to FIGS. 10A and 10B, the soft turn-off is similar to the soft turn-on feature. When an IGBT is undertaking a fault, much higher than normal current is flowing through the IGBT. When IGBT 1 turns off, a voltage spike 61 is developed due to stray inductance 63 of the wiring, which adds to the normal DC link voltage. Voltage spike 61 appears across IGBT 1 at every turn-off. However, during fault conditions, when the current is much higher than normal (perhaps by a factor of 5 to 10), spike voltage 61 is much higher and can destroy IGBT 1. FIGS. 10A and 10B illustrate a 2-level pole and spike voltage 61 when the upper IGBT 1 turns off. Voltage spike (Vspike) 61 is a product of stray inductance (Lstray) 63 times the fall rate of the current as shown by the following equation.

$$Vspike = Lstray \times \frac{dI}{dx} \qquad \text{(Equation 1)}$$

Figure 11:
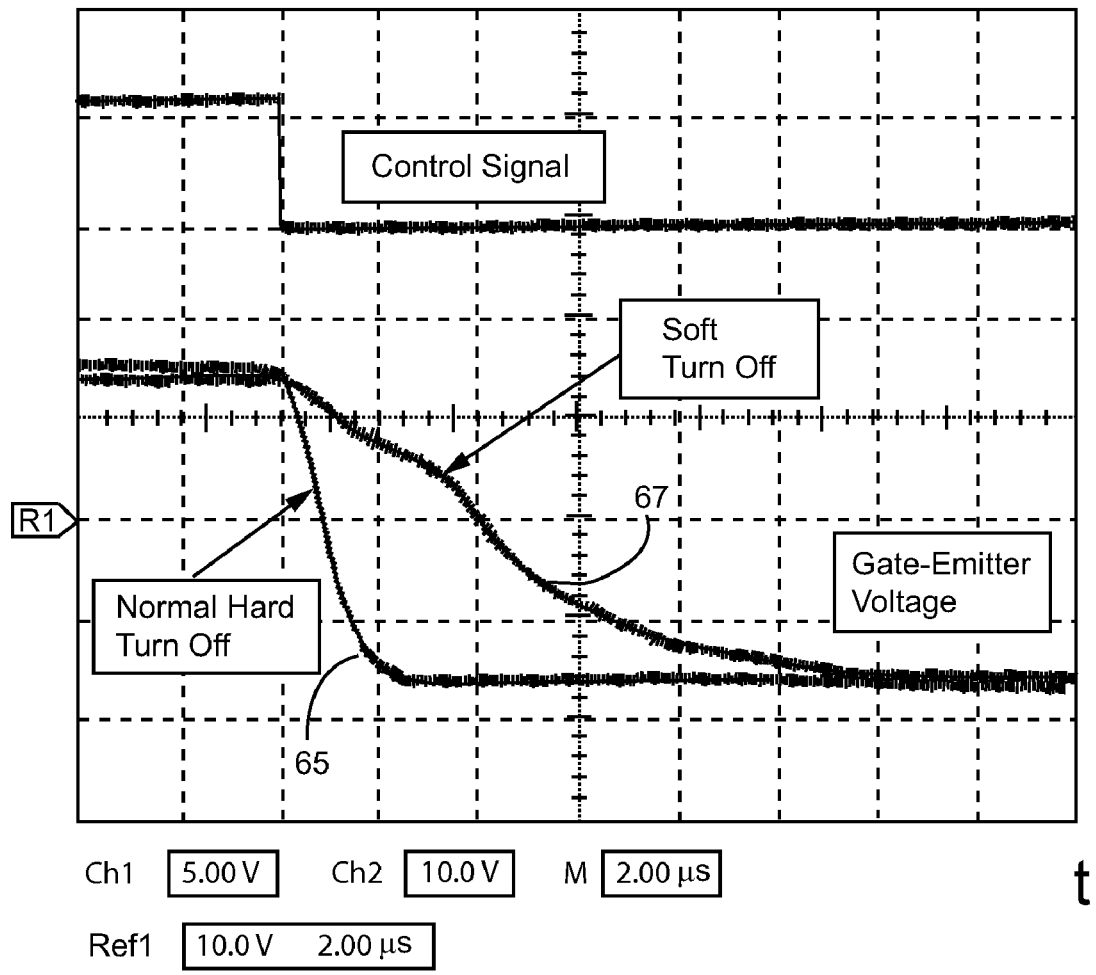
FIG. 11 is a waveform diagram illustrating the gate-emitter voltage ($V_{ge}$) of an IGBT vs. time (t) during a normal turn-off and a soft turn-off.

Since stray inductance 63 is fixed and IGBT 1 is conducting excessive current during a fault, the only way to minimize spike voltage 61 is to control the fall rate of the current. This is the soft turn-off feature. The $V_{ge}$ is ramped down slowly causing the current to drop slower, thus minimizing the voltage spike. FIG. 11 illustrates $V_{ge}$ during a normal hard turn-off 65 (Ref1) and a soft turn-off 67 (Ch2). As can be seen in the waveform, soft turn-off 67 effectively ramps the current of IGBT 1 down, thus minimizing the resulting voltage spike 61.

4) Sliver Pulse Soft Turn-Off

Figure 12:
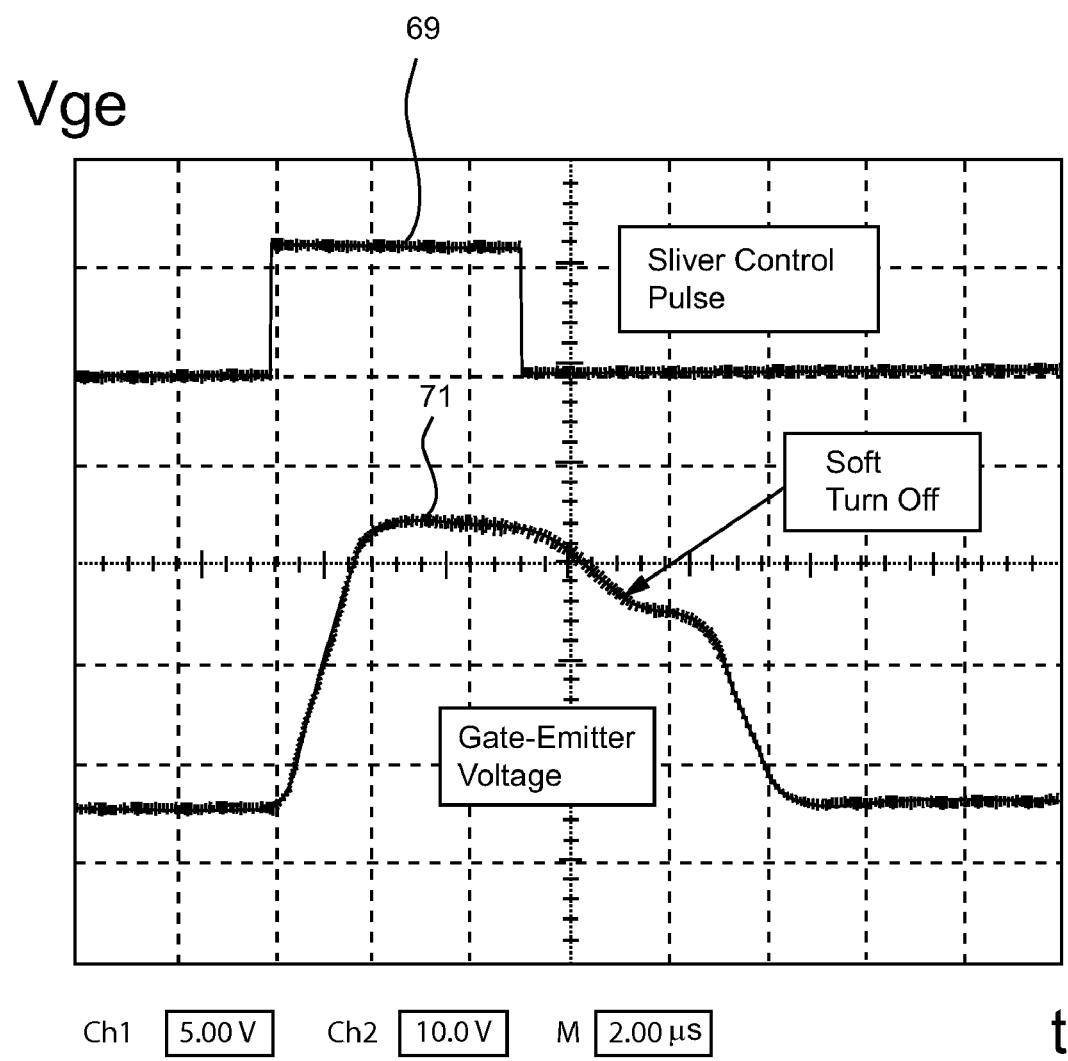
FIG. 12 is a waveform diagram illustrating an input control sliver pulse and the gate-emitter voltage ($V_{ge}$) of an IGBT vs. time (t) during a soft turn-off.

Desaturation feedback module 47 of control and protection feedback module 13 of gate drive 11 measures the collector-emitter voltage ($V_{ce}$) of IGBT 1 to determine if IGBT 1 is conducting excessive current (i.e., undertaking a short circuit). Desaturation feedback module 47 does not typically become active until about 10 μs after IGBT 1 is commanded on. This permits IGBT 1 to turn on without false desaturation trips. However, if gate drive 11 is commanded on with a pulse narrower than 10 μs, a hard turn-off during a short circuit could cause a voltage spike 61 to destroy IGBT 1. During normal operation, control circuitry 27 of power supply 29 will not command IGBT 1 on with such sliver pulses (i.e., 10 μs or less). However, if a sliver pulse is received, gate drive 11 turns off with a soft turn-off to ensure that IGBT 1 will not be destroyed in the event it is undertaking a short circuit. FIG. 12 shows an input control sliver pulse 69 (Ch1) and the $V_{ge}$ of IGBT 1 during a soft turn-off 71 (Ch2).

5) Emergency Turn-Off

Gate drive 11 is self protected and communicates fault status back to control circuitry 27 of power supply 29 through feedback fiber optic cable 33. However, a problem occurs if gate drive 11 has turned off due to a fault and indicated the fault to control circuitry 27 of power supply 29, but the fault current is still flowing through another IGBT, because a FWD has provided a path for the fault current to flow. This is illustrated in FIGS. 13A and 13B.

Figure 13A:
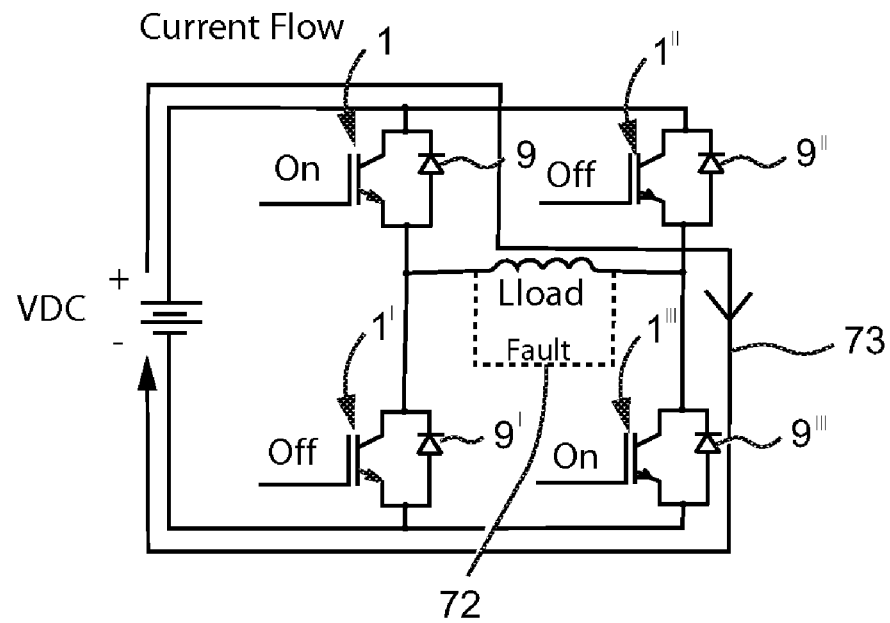
FIGS. 13A and 13B are schematic diagrams of IGBTs arranged in a multi-pole configuration.
Figure 13B:
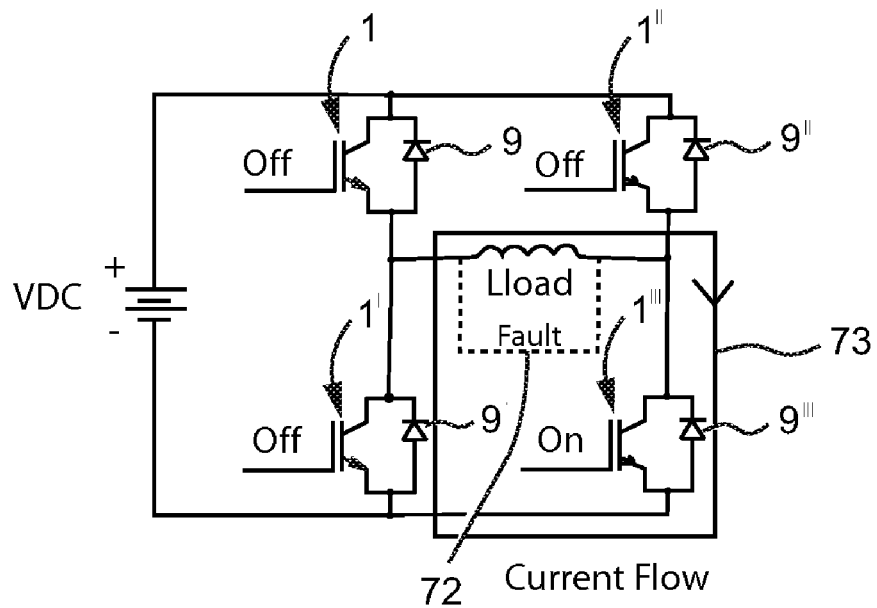

With reference to FIGS. 13A and 13B, gate drive 11 of the upper left IGBT 1 detected a fault 72 across load inductance Lload and performed a soft turn-off (as shown in FIG. 13A). The fault current 73 continues to flow through the lower right IGBT 1''', because the lower left FWD 9' provides a conduction path (as shown in FIG. 13B). The timing is such that gate drive 11 of lower right IGBT 1''' has not yet detected the fault 72. Control circuitry 27 of power supply 29 cannot command the remaining IGBT off, because such action would force the lower right IGBT 1''' to experience a hard turn-off and the resulting voltage spike could destroy IGBT 1'''.

Accordingly, an emergency turn-off feature is activated by control circuitry 27 of power supply 29 by removing light from emergency turn-off fiber optic cable 35. Such action causes gate drive 11 to immediately commence with a soft turn-off when in the 2-level pole configuration. This permits control circuitry 27 of power supply 29 to gracefully turn the IGBTs off when one IGBT detects a fault.

In a multi-level pole configuration during the emergency turn-off, the soft turn-off is active but occurs only when commanded off to avoid the over voltage, as discussed hereinabove.

Gate drive 11 may be applied to any commercial or military IGBT based power supply. For instance, gate drive 11 may be used with an IGBT in a large motor drive. However, this is not to be construed as limiting the present invention as any appropriate use in an IGBT based power supply has been envisioned.

While the present invention has been described with reference to preferred embodiments of the IGBT gate drive, those skilled in the art may make modifications and alterations to the present invention without departing from the scope and spirit of the invention. Accordingly, the above detailed description is intended to be illustrative rather than restrictive. The invention is defined by the appended claims, and all changes to the invention that fall within the meaning and range of equivalency of the claims are to be embraced by their scope.

The invention claimed is:

1. A gate drive for an insulated gate bipolar transistor (IGBT) comprising:
   a control and protection module coupled to a collector terminal of the IGBT;
   an optical communications module coupled to the control and protection module, the optical communications module configured to send control signals to the control and protection module;
   a power supply module coupled to the control and protection module, the power supply module configured to distribute inputted power to the control and protection module; and
   an output power stage module with inputs coupled to the power supply module and the control and protection module, and outputs coupled to a gate terminal and an emitter terminal of the IGBT,
   wherein the control and protection module outputs on/off, soft turn-off and/or soft turn-on signals to the output power stage module, which, in turn, supplies a current based on the signal(s) from the control and protection module for charging or discharging an input capacitance of the IGBT.

2. The gate drive of claim 1, wherein the optical communications module comprises three fiber optic cables that interface with the control and protection module.

3. The gate drive of claim 2, wherein the three fiber optic cables include:
   a control fiber optic cable providing a signal to the control and protection module indicating when to turn on and off;
   a feedback fiber optic cable providing an output signal from the control and protection module indicating whether the gate drive is functioning normally or if a fault has been detected; and
   an emergency turn-off fiber optic cable providing a signal to the control and protection module forcing a protective action if a fault has been detected.

4. The gate drive of claim 1, wherein the optical communications module provides an interface between control circuitry of a power supply and the control and protection module.

5. The gate drive of claim 1, wherein the control and protection module comprises a desaturation and sliver protection module coupled to the optical communications module, the output power stage module and the power supply module.

6. The gate drive of claim 5, wherein the control and protection module comprises a desaturation feedback module coupled to the desaturation and sliver protection module and the collector terminal of the IGBT.

7. The gate drive of claim 6, wherein the desaturation feedback module of the control and protection module measures collector-emitter voltage of the IGBT to determine if the IGBT is conducting excessive current.

8. The gate drive of claim 1, wherein the control and protection module includes a jumper for allowing the gate drive to monitor and be coupled to IGBTs configured in a multi-level pole configuration.

9. The gate drive of claim 1, wherein the power supply module receives a voltage from a power supply, isolates the inputted voltage and distributes the isolated voltage to the control and protection module and the output power stage module.

10. The gate drive of claim 1, wherein the output power stage module includes a plurality of MOSFET transistors configured to provide the necessary current for charging and discharging the input capacitance of the IGBT.

11. A method of driving an insulated gate bipolar transistor (IGBT) comprising:
   providing a gate drive coupled to at least one IGBT, the gate drive comprising:
   a control and protection module coupled to a collector terminal of the IGBT;
   an optical communications module coupled to the control and protection module and to control circuitry of a power supply;
   a power supply module coupled to the control and protection module and the power supply; and
   an output power stage module with inputs coupled to the power supply module and the control and protection module, and outputs coupled to a gate terminal and an emitter terminal of the IGBT;

distributing inputted power from the power supply module to the control and protection module and the output power stage module;

sending control signals comprising at least one of on/off, soft turn-off, soft turn-on and emergency turn-off signals from the control circuitry of the power supply through the optical communications module to the control and protection module;

outputting control signals from the control and protection module to the output power stage module based on the control signals from the control circuitry of the power supply; and supplying a current based on the signal(s) from the control and protection module for charging or discharging an input capacitance of the IGBT.

12. The method of claim 11, wherein the control and protection module comprises a desaturation and sliver protection module coupled to the optical communications module, the output power stage module and the power supply module.

13. The method of claim 12, wherein the control and protection module comprises a desaturation feedback module coupled to the desaturation and sliver protection module and the collector terminal of the IGBT.

14. The method of claim 13, wherein the desaturation feedback module of the control and protection module measures collector-emitter voltage of the IGBT to determine if the IGBT is conducting excessive current.

15. The method of claim 11, wherein the control and protection module includes a jumper for allowing the gate drive to monitor and be coupled to IGBTs configured in a multi-level pole configuration.

16. The method of claim 11, wherein the power supply module receives a voltage from the power supply, isolates the inputted voltage and distributes the isolated voltage to the control and protection module and the output power stage module.

17. The method of claim 11, wherein the output power stage module includes a plurality of MOSFET transistors configured to provide the necessary current for charging and discharging the input capacitance of the IGBT.

18. The method of claim 11, wherein the optical communications module comprises three fiber optic cables that interface with the control and protection module.

19. The method of claim 18, wherein the three fiber optic cables include:

a control fiber optic cable providing a signal to the control and protection module indicating when to turn on and off;

a feedback fiber optic cable providing an output signal from the control and protection module to the control circuitry of the power supply indicating whether the gate drive is functioning normally or if a fault has been detected; and an emergency turn-off fiber optic cable providing a signal to the control and protection module forcing a protective action if a fault has been detected by the control circuitry of the power supply.

20. A gate drive for an insulated gate bipolar transistor (IGBT) comprising:

an optical communications module providing an interface between the gate drive and control circuitry of a power supply, the optical communications module comprising:

a control fiber optic cable providing a signal to a control and protection module of the gate drive indicating when to turn on and off;

a feedback fiber optic cable providing an output signal from the control and protection module to the control circuitry of the power supply indicating whether the gate drive is functioning normally or if a fault has been detected; and an emergency turn-off fiber optic cable providing a signal to the control and protection module forcing a protective action if a fault has been detected by the control circuitry of the power supply;

the control and protection module having an output coupled to a collector terminal of the IGBT;

a power supply module coupled to the control and protection module, the power supply module configured to distribute inputted power to the control and protection module; and an output power stage module with inputs coupled to the power supply module and the control and protection module, and outputs coupled to a gate terminal and an emitter terminal of the IGBT, wherein the control and protection module outputs on/off, soft turn-off and/or soft turn-on signals to the output power stage module, which, in turn, supplies a current based on the signal(s) from the control and protection module for charging or discharging an input capacitance of the IGBT.

* * * * *